US009576935B2

(12) United States Patent
Bauer et al.

(10) Patent No.: US 9,576,935 B2

(45) Date of Patent: Feb. 21, 2017

(54) METHOD FOR FABRICATING A SEMICONDUCTOR PACKAGE AND SEMICONDUCTOR PACKAGE

(71) Applicant: Infineon Technologies AG, Neubiberg (DE)

(72) Inventors: Michael Bauer, Nittendorf (DE); Ludwig Heitzer, Falkenfels (DE); Christian Stuempfl, Schmidgaden (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/254,214

(22) Filed: Apr. 16, 2014

(65) Prior Publication Data

US 2015/0303135 A1 Oct. 22, 2015

(51) Int. Cl.

| | |
|---|---|
| ***H01L 23/48*** | (2006.01) |
| ***H01L 25/065*** | (2006.01) |
| ***H01L 25/00*** | (2006.01) |
| ***H01L 21/56*** | (2006.01) |
| ***H01L 23/31*** | (2006.01) |
| *H01L 23/495* | (2006.01) |

(52) U.S. Cl.

CPC ........... *H01L 25/0657* (2013.01); *H01L 21/56* (2013.01); *H01L 23/3121* (2013.01); *H01L 23/49548* (2013.01); *H01L 25/0655* (2013.01); *H01L 25/50* (2013.01); *H01L 23/49541* (2013.01); *H01L 2924/0002* (2013.01)

(58) Field of Classification Search

USPC .......................................................... 257/723

See application file for complete search history.

(56) References Cited

U.S. PATENT DOCUMENTS

| | | | | |
|---|---|---|---|---|
| 7,723,836 | B2 * | 5/2010 | Kwon | H01L 23/49575 257/660 |
| 8,354,741 | B2 | 1/2013 | Kang et al. | |
| 2006/0284286 | A1 | 12/2006 | Kamino | |
| 2007/0018308 | A1 * | 1/2007 | Schott | B23K 3/0623 257/700 |
| 2008/0061414 | A1 | 3/2008 | Retuta et al. | |
| 2008/0122070 | A1 * | 5/2008 | Tseng | H01L 21/568 257/720 |
| 2008/0315385 | A1 * | 12/2008 | Gerber | H01L 21/561 257/686 |
| 2009/0127682 | A1 | 5/2009 | Kim et al. | |
| 2009/0146760 | A1 * | 6/2009 | Reefman | H01L 23/3107 333/184 |
| 2010/0314635 | A1 * | 12/2010 | Brunner | H01L 33/62 257/88 |
| 2013/0341780 | A1 * | 12/2013 | Scharf | H01L 24/24 257/677 |

FOREIGN PATENT DOCUMENTS

WO 2013037188 A1 3/2013

* cited by examiner

*Primary Examiner* — Thao P Le

(74) *Attorney, Agent, or Firm* — Murphy, Bilak & Homiller, PLLC

(57) ABSTRACT

A method for fabricating semiconductor packages includes providing a first substrate having an aperture, providing a first semiconductor chip, connecting the first semiconductor chip to the first substrate, filling the aperture with a first insulating material and encapsulating the semiconductor chip with a second insulating material to create a first encapsulation body.

12 Claims, 7 Drawing Sheets

METHOD FOR FABRICATING A SEMICONDUCTOR PACKAGE AND SEMICONDUCTOR PACKAGE

TECHNICAL FIELD

This application relates to a method for fabricating a semiconductor package and a semiconductor package.

BACKGROUND

During fabrication of a semiconductor package that includes a semiconductor chip attached to a substrate, the semiconductor chip is encapsulated. The substrate may include an aperture and individual substrates may exhibit differently sized apertures due to fabrication tolerances or other factors. This may result in design or size variations of the fabricated semiconductor package which may result in electrical, mechanical and thermal deficiencies of the semiconductor package.

SUMMARY

According to an embodiment, a semiconductor package includes a substrate having an aperture and a semiconductor chip connected to the substrate. A first insulating material is arranged in the aperture. A second insulating material encapsulates the semiconductor chip.

According to another embodiment, an assemblage includes a first and a second semiconductor package. The first and a second semiconductor packages include a substrate having an aperture and a semiconductor chip connected to the substrate. The first and a second semiconductor packages further include a first insulating material is arranged in the aperture and a second insulating material encapsulates the semiconductor chip. The first and second semiconductor packages are connected. A size of the aperture of the first semiconductor package is different from a size of the aperture of the second semiconductor package.

According to another embodiment, a method for fabricating semiconductor packages includes providing a first substrate having an aperture and providing a first semiconductor chip. The method further includes connecting the first semiconductor chip to the first substrate, filling the aperture with a first insulating material and encapsulating the semiconductor chip with a second insulating material to create a first encapsulation body.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1, which comprises

FIG. 2, which comprises

FIG. 3, which comprises

FIG. 4, which comprises

DESCRIPTION OF EMBODIMENTS

Figures 1A, 1B, 1C:
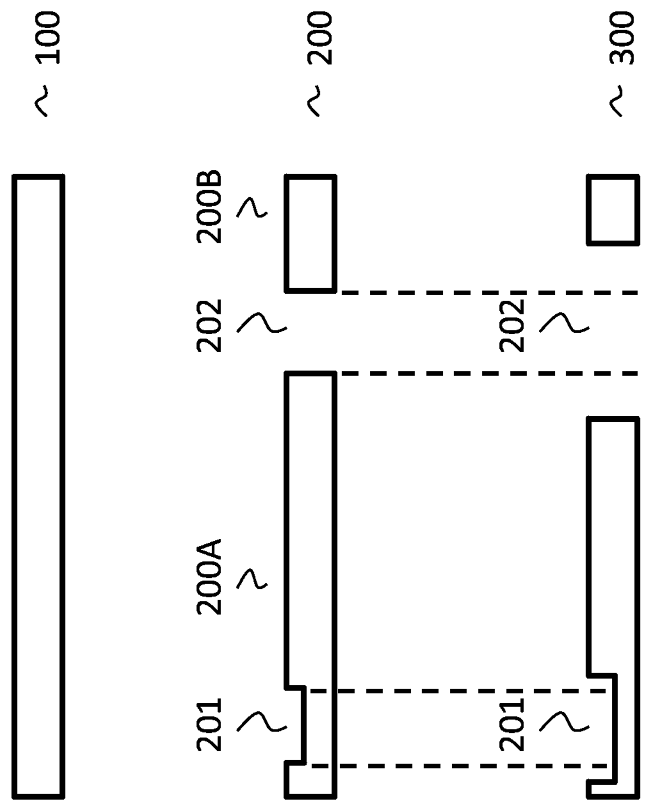
FIG. 1A-1C, shows a schematic cross-section view of exemplary substrates designed for incorporation into a semiconductor package.

In the following detailed description, reference is made to the accompanying drawings, which form a part thereof, and in which is shown by way of illustration specific embodiments in which the invention may be practiced. It may be evident, however, to one skilled in the art that one or more aspects of the embodiments may be practiced with a lesser degree of the specific details. In other instances, known structures and elements are shown in schematic form in order to facilitate describing one or more aspects of the embodiments. In this regard, directional terminology, such as “top,” “bottom,” “left,” “right,” “upper,” “lower” etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms “include,” “have,” “with” or other variants thereof are used in either the detailed description or the claims, such terms are intended to be inclusive in a manner similar to the term “comprise.” The terms “coupled” and “connected,” along with derivatives thereof may be used. It should be understood that these terms may be used to indicate that two elements cooperate or interact with each other regardless whether they are in direct physical or electrical contact, or they are not in direct contact with each other; intervening elements or layers may be provided between the “bonded,” “attached,” or “connected” elements. Also, the term “exemplary” is merely meant as an example, rather than the best or optimal. The following detailed description, therefore, is not to be taken in a limiting sense, and the scope of the present invention is defined by the appended claims.

The semiconductor chip(s) described further below may be of different types, may be manufactured by different technologies and may include for example integrated electrical, electro-optical or electro-mechanical circuits and/or passives, logic integrated circuits, control circuits, microprocessors, memory devices, etc.

The semiconductor chip(s) can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor chip(s) considered herein may be thin. In order to allow handling or manipulation of the semiconductor chip, e.g. handling/manipulation required for packaging, eWLP (embedded Wafer Level Packaging), or semiconductor device assembly, the semiconductor chip may form part of a composite chip. A composite chip may include the semiconductor chip and a reinforcing chip secured to the semiconductor chip. The reinforcing chip adds stability and/or strength to the composite chip to make it manageable.

The semiconductor packages described below may include one or more semiconductor chips. By way of example, one or more semiconductor power chips may be included. Further, one or more logic integrated circuits may be included in the devices. The logic integrated circuits may be configured to control the integrated circuits of other semiconductor chips, for example the integrated circuits of power semiconductor chips. The logic integrated circuits may be implemented in logic chips.

The semiconductor chip(s) may have contact pads (or electrodes), which allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor chip(s) may be bonded to a substrate, which may also be called a carrier. The carrier may be a (permanent) device carrier used for packaging. The carrier may comprise or consist of any sort of material as, for example, ceramic or metallic material, copper or copper alloy or iron/nickel alloy. The carrier can be connected mechanically and electrically with one contact element of the semiconductor chip(s). The semiconductor chip(s) can be connected to the carrier by one or more of re-flow soldering, vacuum soldering, diffusion soldering, or adhering by means of a conductive adhesive. If diffusion soldering is used as the connection technology between the semiconductor chip(s) and the carrier, solder materials can be used which result in inter-metallic phases at the interface between the semi-conductor and the carrier due to interface diffusion processes after the soldering process. In case of copper or iron/nickel carriers it is therefore desirable to use solder materials comprising or consisting of AuSn, AgSn, CuSn, AgIn, AuIn or CuIn. Alternatively, if the semiconductor chip(s) are to be adhered to the carrier, conductive adhesives can be used. The adhesives can, for example, be based on epoxy resins which can be enriched with particles of gold, silver, nickel or copper to enhance their electrical conductivity.

The contact elements of the semiconductor chip(s) may include a diffusion barrier. The diffusion barrier prevents in case of diffusion soldering that the solder material diffuses from the carrier into the semiconductor chip(s). A thin titanium layer on the contact element may, for example, effect such a diffusion barrier.

The semiconductor chip(s) may be covered with an encapsulation material in order to be embedded in an encapsulant (artificial wafer) for eWLP processing or after being bonded to a device carrier (substrate). The encapsulation material may be electrically insulating. The encapsulation material may comprise or be made of any appropriate plastic or polymer material such as, a duroplastic, thermoplastic or thermosetting material or laminate (prepreg).

In several embodiments layers or layer stacks are applied to one another or materials are applied or deposited onto layers. It should be appreciated that any such terms as "applied" or "deposited" are meant to cover all varieties and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

With respect to FIG. 1A, an exemplary substrate 100 is shown. A semiconductor package like the semiconductor packages described in the following may include such a substrate 100. Note that the substrate 100 may also be referred to as a carrier. The substrate 100 may comprise a leadframe.

The substrate 100 schematically depicted in FIG. 1A may be the result of a first substrate production process. However, in the first substrate production process, not all structural elements in the substrate 100 may have been formed, which are necessary for the correct function of a semiconductor package of which substrate 100 is to be a part of. Such structural elements may be formed in one or more subsequent structuring process steps. For example, etching techniques known in the art may be applied to the substrate 100 in order to fabricate such structural elements.

FIG. 1B shows a schematic example of a substrate 200 which is the result of the application of such subsequent structuring steps to substrate 100. Substrate 200 comprises a first structural element 201 and a second structural element 202. Structural element 202 separates and electrically isolates a first substrate element 200A from a second substrate element 200B. For example, first substrate element 200A may comprise a die pad and second substrate element 200B may comprise an outer lead of the semiconductor package. Note that in the following structural elements like the exemplary structural elements 201, 202 may also be called apertures.

The structuring processes used to create such apertures may exhibit a tolerance which may result in individual substrates having distinctly sized apertures. For example, an etching process according to an embodiment may exhibit a tolerance of up to about ±40 μm in the size of the resulting apertures. FIG. 1C schematically shows a substrate 300, wherein said tolerances in the structuring processes resulted in apertures which are larger than the apertures of substrate 200.

Figure 2A:
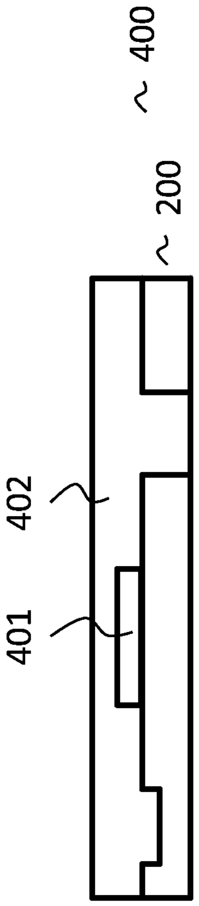
FIGS. 2A and 2B, shows a schematic cross-section view of a semiconductor package comprising a properly formed encapsulant and a semiconductor package comprising a non-properly formed encapsulant.

With respect to FIG. 2A, a semiconductor package 400 is shown. The semiconductor package 400 includes a substrate like such as substrate 200, for example, a semiconductor chip 401 and an encapsulant 402 encapsulating the semiconductor chip 401 and at least partially encapsulating the substrate 200.

Encapsulant 402 may be fabricated using different techniques known in the art. For example, encapsulant 402 may be fabricated by molding, in particular transfer molding. According to another embodiment, encapsulant 402 may be fabricated by providing a laminate and laminating the laminate over substrate 200 and semiconductor chip 401. According to an embodiment, the laminate is provided in the form of a fiber reinforced composite. According to an embodiment, the fiber reinforced composite is a fiber reinforced polymer. The fibers may be glass fibers. In a particular embodiment, the encapsulant 402 may comprise a glass-fiber reinforced plastic (GFRP). The fiber reinforced composite may comprise a resin. The polymer or plastic may comprise one or more of epoxy and a polyimide and an acrylate. Note that a molded encapsulant does not comprise such a fiber reinforced composite.

The tolerances of the substrate structuring processes described above with respect to FIGS. 1B and 1C may result in a difference in the amount of encapsulation material required in individual semiconductor packages. For example, in the case that said tolerances result in a substrate 300 with bigger than usual apertures and a fixed amount of encapsulation material is provided to each semiconductor package during fabrication, the resulting encapsulation body may not form correctly. That is, the encapsulant may for example exhibit one or more of undesired bubbles and undesired surface features. Conversely, in the case that said tolerances result in smaller than usual apertures, there may be a surplus of encapsulation material.

Figure 2B:
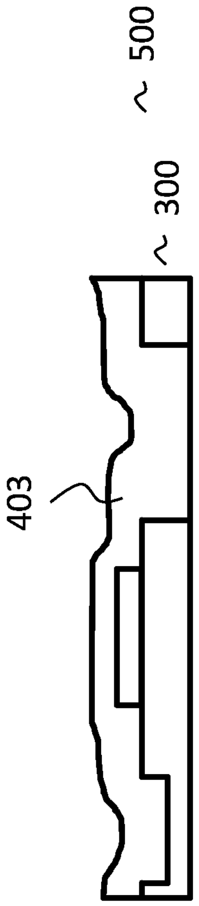

With respect to FIG. 2B there is depicted an example of a semiconductor package 500 comprising substrate 300 and an incorrectly formed encapsulant 403. Here, a case of an insufficient amount of encapsulation material is shown schematically. The incorrectly formed encapsulant 403 may comprise bubbles which are not shown. Encapsulant 403 may exhibit degraded electrical, mechanical and thermal properties compared to correctly formed encapsulant 402.

In the case that molding techniques, in particular transfer molding, are used for fabricating the encapsulant, the issue of an incorrectly formed encapsulant 403 usually does not arise. For example, in transfer molding, the substrate 200 with attached semiconductor chip 401 is put into a cavity and then the cavity is completely filled with encapsulation material. Therefore, tolerances in the apertures of the substrate do not influence the formation of a correctly formed encapsulation body.

However, in the case that lamination techniques are used for fabricating the encapsulation body, it may be technically difficult or even impossible to adjust for tolerances in the amount of encapsulation material required in individual semiconductor packages. The reason is that in lamination techniques the encapsulation material is provided in the form of a laminate which may comprise a fiber reinforced composite. A removal of excess material after lamination or an addition of further encapsulation material is usually not envisaged. Therefore, issues like those described with respect to FIG. 2B may arise.

Figure 3A:
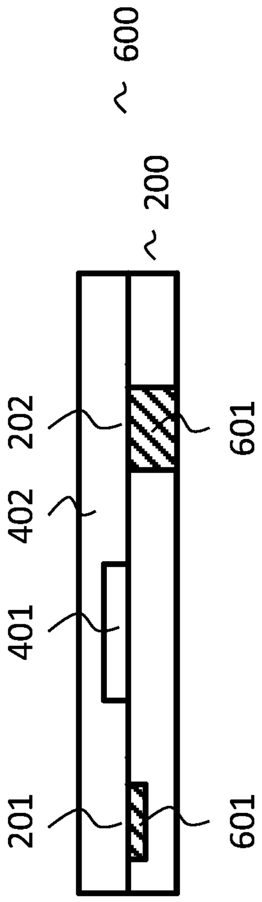
FIGS. 3A and 3B, shows a schematic cross-section view of two semiconductor packages comprising a filler material filling apertures on a substrate.

With respect to FIG. 3A a semiconductor package 600 is shown. Semiconductor package 600 comprises substrate 200 comprising structures 201 and 202, semiconductor chip 401 attached to the substrate 200, encapsulant 402 and a filler material 601 filling structures 201 and 202.

Figure 3B:
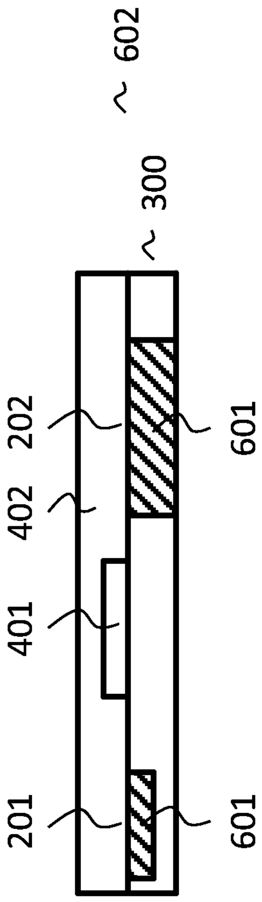

With respect to FIG. 3B a semiconductor package 602 is shown. Semiconductor package 602 comprises substrate 300 comprising bigger apertures 201, 202 than substrate 200, semiconductor chip 401 attached to substrate 300, encapsulant 402 and filler material 601 filling the apertures 201, 202.

Filler material 601 filling the apertures 201, 202 of substrates 200 and 300 may significantly reduce the influence of the size of the apertures 201, 202 and the amount of encapsulation material required to form encapsulant 402. Filler material 601 may even make the amount of encapsulation material required to form encapsulant 402 completely independent from the size of the apertures 201, 202. In particular, in the case that lamination techniques are used to form encapsulant 402, this may help in fabricating a correct encapsulation body 402 irrespective of the size of the apertures.

According to an embodiment, filler material 601 may comprise an insulating material. Filler material 601 may comprise a mold. In particular, it may comprise one or more of a resin, a polyimide, an acrylate and epoxy. According to an embodiment, filler material 601 may exhibit the same or almost the same electrical, thermal and mechanical properties as encapsulant 402. In one embodiment filler material 601 may comprise the same insulating material as encapsulant 402. According to another embodiment, filler material 601 may comprise one or more or even completely different insulating materials compared to encapsulant 402. Note however, that according to all embodiments filler material 601 is deposited on the substrate in fluid form and does therefore not comprise a fiber reinforced composite like the laminate described above.

According to an embodiment of a method for fabricating semiconductor packages, filler material 601 is used to smooth out irregularities in the substrate before applying a laminate to the substrate. Filler material may be used to fill superficial as well as deep apertures including through-holes in the substrate.

In the following, exemplary methods for applying the filler material 601 to a substrate are described. Filler material 601 may be applied locally to the apertures or it may be applied globally, that is over a large part of the substrate or even over the whole substrate.

According to an exemplary method, the filler material is applied globally to the substrate. Screen-printing, which is well known in the art, may be used in the method. Such a screen-printing method comprises a first step, wherein a certain amount of fluid filler material is provided. The filler material may have been heated beforehand in order to make it fluid. The amount of filler material may, for example, be applied at an edge of the substrate 200 or over the whole substrate 200. In a second step, the filler material is dispersed over the substrate 200 mechanically in order to fill the apertures of substrate 200 and to remove excess material. For example, a squeegee may be used to this end. By moving the squeegee across the substrate 200 and thereby pushing a front of filler material before it, the filler material flows into apertures in the substrate 200. Excess filler material may be simply pushed away from substrate 200 by the squeegee. It is also possible to move substrate 200 relative to the squeegee. Note that a screen may be provided between the squeegee and substrate 200 and the amount of filler material may be provided on top of the screen.

Figures 4A, 4B, 4C:
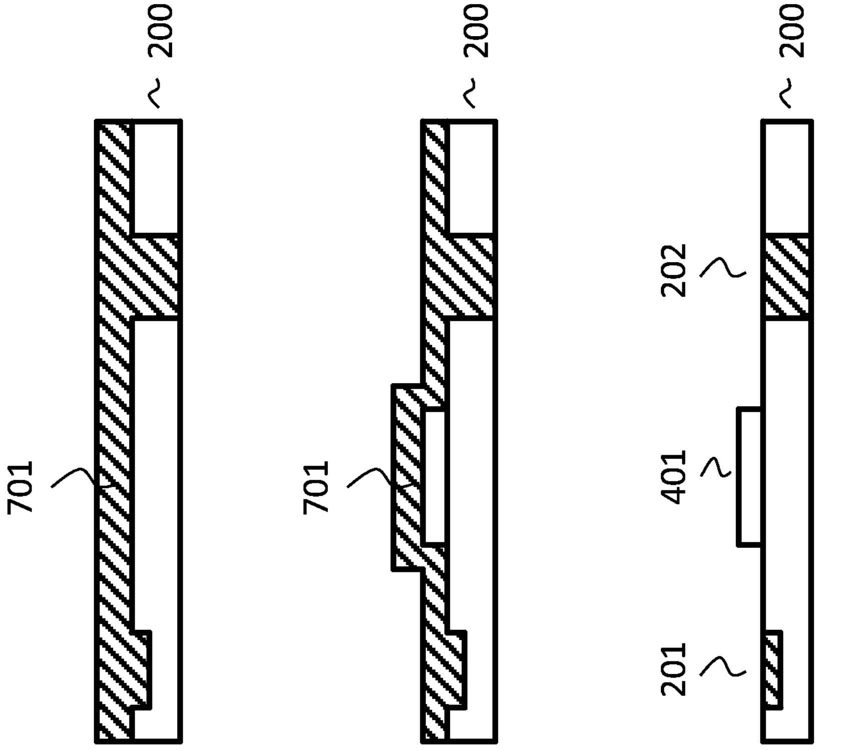
FIG. 4A-4C, shows a schematic cross-section view of intermediate products of various methods for fabricating a semiconductor package comprising a filler material filling an aperture on a substrate.

The screen-printing method may produce a thin layer of filler material 701 on top of substrate 200 as schematically shown in FIG. 4A. Layer 701 may be an unintentional byproduct of the screen-printing method. However, layer 701 may also be fabricated intentionally by proper adjustment of the process parameters of the screen-printing method. In a subsequent step layer 701 may be completely removed such that only filler material deposits 601 filling the apertures of the substrate 200 remain. For example, a photolithographic process may be used to remove layer 701. However, it may also be beneficial to remove layer 701 only partially by well-known structuring techniques like, for example, a photolithographic process or a laser ablation process. Subsequently, the structured layer may be used as a substrate for fabricating electrical wiring. In particular, such electrical wiring may comprise vias.

After the screen-printing step, a laminate is laminated over substrate 200, filler material 601 (and layer 701) as described in more detail further below.

Another exemplary method for globally applying filler material to substrate 200 includes using a curtain coating process. Curtain coating processes are well known in the art. A curtain of fluid filler material is provided using a dispensing unit. Substrate 200 traverses the curtain of fluid filler material, whereby apertures in substrate 200 are filled and a layer 701 on top of the substrate is formed as shown in FIG. 4A. Alternatively, instead of moving substrate 200 relative to the dispensing unit, the dispensing unit may be moved relative to substrate 200.

After curtain coating substrate 200, excess filler material may be removed. For example, excess filler material may accumulate on the edge of substrate 200. Excess filler material is removed while it is still fluid according to an embodiment and excess filler material is removed after solidification according to another embodiment. Furthermore, layer 701 may be structured or even completely removed as described above.

Note that with respect to FIG. 4A, the result of a screen-printing process or a curtain coating process for filling apertures with filler material is shown as applied to substrate 200 before semiconductor chip attachment. For example, filler material may be applied to a leadframe right after leadframe fabrication. However, according to another embodiment, a screen-printing process or a curtain coating process is applied after semiconductor chip attachment. That is, the semiconductor chip is also coated by layer 701 of filler material as shown in FIG. 4B.

With respect to FIG. 4C, the result of a filling method is shown, wherein apertures 201, 202 on a substrate 200 are filled locally with filler material. Local filling of the apertures 201, 202 without producing a layer 701 of filler material can for example be achieved using a dispensing process well known in the art. Note that a local filling method for filling apertures 201, 202 as well may be used before or after semiconductor chip attachment.

Figure 5:
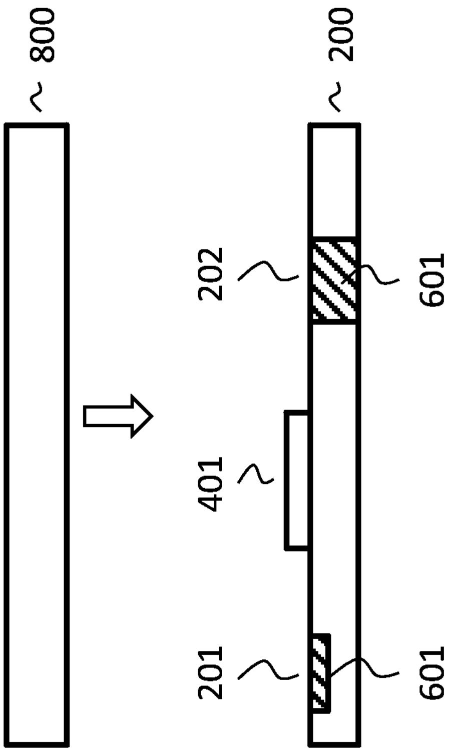
FIG. 5 shows a schematic cross-section view of a method for fabricating a semiconductor package comprising a filler material filling an aperture on a substrate.

After filling apertures 201, 202 with filler material 601, a laminate 800 is provided as shown in FIG. 5. Laminate 800 is laminated over substrate 200 comprising filler material 601 in apertures 201, 202 in order to create encapsulant 402 as depicted in FIG. 3A, 3B. Laminate 800 may comprise a fiber reinforced composite as already mentioned further above. Furthermore, laminate 800 may comprise copper, in particular one or more copper foils. The one or more copper foils may be designed to be structured for creating a wiring for electrically connecting the semiconductor chip 401. The one or more copper foils may for example be located on a first main face and a second main face of laminate 800.

Note that laminate 800 may exhibit a stacked structure with a stack of different functional layers lying atop of one another. Furthermore, more than one laminate layer 800 may be provided in order to fabricate a stacked encapsulant 402. A stacked encapsulant may comprise functional layers for providing a wiring structure.

Figure 6:
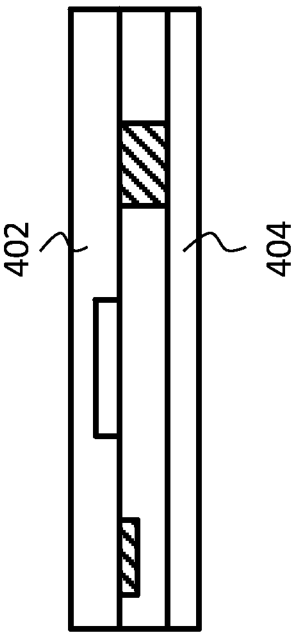
FIG. 6 shows a schematic cross-section view of a semiconductor package comprising a filler material filling an aperture on a substrate.

Filler material 601 need not necessarily be partially exposed. As schematically shown in FIG. 6, it is possible that an encapsulant 404 and encapsulant 402 completely encapsulate filler material 601. Note that encapsulants 402, 404 may be parts of a single encapsulation body or may be two distinct encapsulation bodies.

The methods for fabricating a substrate comprising filler material 601 have been described with respect to a single substrate. However, it is possible to use these methods in a batch process. That is, methods for filling apertures in substrates may be performed on substrates which are still part of an assemblage of substrates, like, for example a leadframe strip. Batch processes may exhibit a significant cost advantage. Laminating may also be performed as part of a batch process.

The implementation of a filler material has been described with respect to adjusting for tolerances in aperture fabrication. However, the usage of filler material does not have to be restricted to these cases. For example, it may also be beneficial to use filler material to adjust for intentional variances in apertures. This way it may be possible to use identical laminates for laminating over different types of substrates, which may be cost efficient.

In the following description and claims different embodiments of a method for fabricating a chip module are described as a particular sequence of processes or measures, in particular in a flow diagram. It is to be noted that the embodiments should not be limited to the particular sequence described. Particular ones or all of different processes or measures can also be conducted simultaneously or in any other useful and appropriate sequence.

Figure 7:
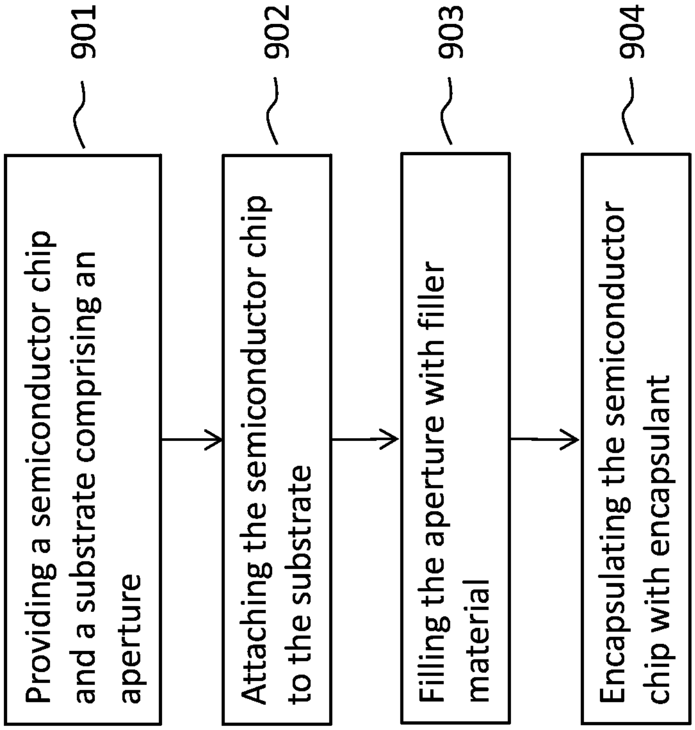
FIG. 7 shows a flow chart of a method for fabricating a semiconductor package.

With respect to FIG. 7, a flow chart depicting a method 900 for fabricating a semiconductor package is shown, wherein method 900 comprises steps 901-904. First step 901 comprises providing a semiconductor chip and a substrate comprising an aperture, second step 902 comprises attaching the semiconductor chip to the substrate, third step 903 comprises filling the aperture with filler material and fourth step 904 comprises encapsulating the semiconductor chip with an encapsulant.

Figure 8:
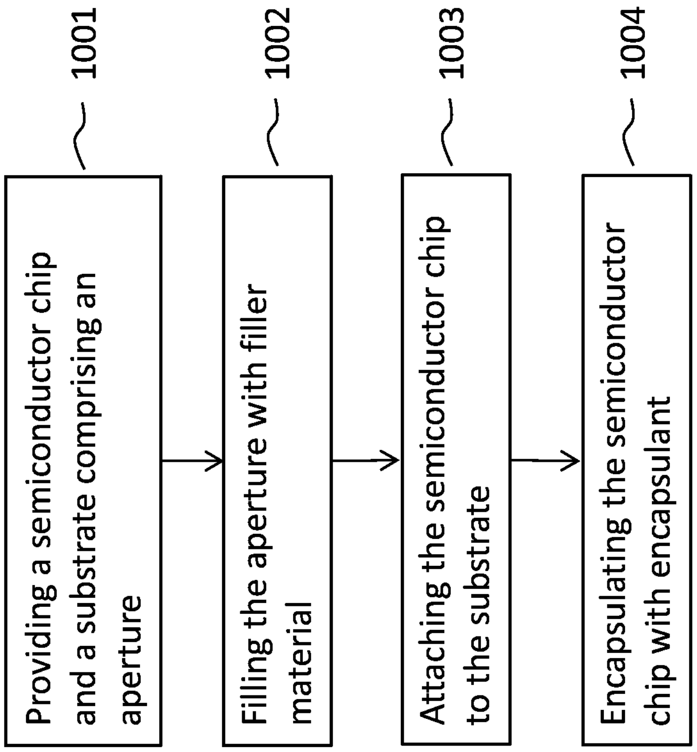
FIG. 8 shows a flow chart of a further method for fabricating a semiconductor package.

With respect to FIG. 8, a flow chart depicting a method 1000 for fabricating a semiconductor package is shown, wherein method 1000 comprises steps 1001-1004. First step 1001 comprises providing a semiconductor chip and a substrate comprising an aperture, second step 1002 comprises filling the aperture with filler material, third step 1003 comprises attaching the semiconductor chip to the substrate and fourth step 1004 comprises encapsulating the semiconductor chip with an encapsulant.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

While embodiments of the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A semiconductor package, comprising:

a substrate comprising an aperture;

a semiconductor chip connected to the substrate;

a first insulating material arranged in the aperture; and a second insulating material laminated onto the semiconductor chip, wherein the second insulating material comprises reinforcing fibers and wherein the first insulating material is free of any reinforcing fibers, and wherein the first insulating material is at least partially exposed.

2. The semiconductor package of claim 1, wherein the substrate comprises a leadframe.

3. The semiconductor package of claim 1, wherein the second insulating material comprises a laminate.

4. The semiconductor package of claim 3, wherein the laminate comprises a fiber reinforced polymer.

5. The semiconductor package of claim 4, wherein the fiber reinforced polymer comprises a glass-fiber reinforced plastic.

6. The semiconductor package of claim 1, wherein the first insulating material comprises one or more of an epoxy, a polyimide and an acrylate.

7. The semiconductor package of claim 6, wherein the second insulating material comprises the same epoxy or polyimide as the first insulating material.

8. The semiconductor package of claim 1, wherein the first insulating material is completely encapsulated by the second insulating material.

9. The semiconductor package of claim 1, wherein the second substrate element comprises an outer lead of the semiconductor package.

10. The semiconductor package of claim 1, wherein the semiconductor package comprises a second semiconductor chip.

11. A semiconductor package, comprising:

a substrate comprising an aperture;

a semiconductor chip connected to the substrate;

a first insulating material arranged in the aperture; and a second insulating material laminated onto the semiconductor chip, wherein the second insulating material is different from the first insulating material, and wherein the second insulating material is arranged directly on top of the first insulating material.

12. A semiconductor package, comprising:

a substrate comprising an aperture;

a semiconductor chip connected to the substrate;

a first insulating material arranged in the aperture; and a second insulating material laminated onto the semiconductor chip, wherein the second insulating material comprises reinforcing fibers and wherein the first insulating material is free of any reinforcing fibers, and wherein the substrate comprises a first and a second substrate element electrically isolated from one another by the aperture, and wherein the semiconductor chip is connected to the first substrate element.

* * * * *